US009760436B2

(12) United States Patent
Amato et al.

(10) Patent No.: US 9,760,436 B2
(45) Date of Patent: Sep. 12, 2017

(54) DATA STORAGE ERROR PROTECTION

(71) Applicant: Micron Technology, Inc., Boise, ID (US)

(72) Inventors: Paolo Amato, Pagazzano (IT); Marco Sforzin, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 14/735,803

(22) Filed: Jun. 10, 2015

(65) Prior Publication Data

US 2016/0364294 A1 Dec. 15, 2016

(51) Int. Cl.

*H03M 13/29* (2006.01)
*G06F 11/10* (2006.01)
*G06T 11/00* (2006.01)
*G11C 29/52* (2006.01)
*G11C 29/04* (2006.01)

(52) U.S. Cl.

CPC .......... *G06F 11/1072* (2013.01); *G11C 29/52* (2013.01); *G11C 2029/0411* (2013.01)

(58) Field of Classification Search

CPC ...... G06F 11/1072; G06F 11/10; G11C 29/52; H04L 1/0057; H03M 13/1585; H03M 13/2918; H03M 13/2945; H03M 13/6561; H04J 2013/0037

See application file for complete search history.

(56) References Cited

U.S. PATENT DOCUMENTS

2012/0086803 A1* 4/2012 Malzbender ......... G01B 11/026 348/140
2016/0139988 A1* 5/2016 Muralimanohar .. G06F 11/1004 714/766

OTHER PUBLICATIONS

Lin, et al. "Error Control Coding," Prentice Hall, Jun. 7, 2004, pp. 263-264.

Corbett, et al. "Row-Diagonal Parity for Double Disk Failure Correction," Proceedings of the Third Usenix Conference on File and Storage Technologies, Mar. 31, 2004, 15 pp.

Blaum, et al. "EVENODD: An Efficient Scheme for Tolerating Double Disk Failures in RAID Architectures," IEEE Transactions on Computers, vol. 44, No. 2, pp. 192-202, Feb. 1995.

Plank, et al. "SD Codes: Erasure Codes Designed for How Storage Systems Really Fail," 11th Usenix Conferance on File and Storage Technologies, Nov. 2012, 9 pp.

Huang, et al. "STAR: An Efficient Coding Scheme for Correcting Triple Storage Node Failures," IEEE Transactions on Computers, vol. 57, No. 7, pp. 889-901, Jul. 2008.

* cited by examiner

*Primary Examiner* — Phung M Chung

(74) *Attorney, Agent, or Firm* — Brooks, Cameron & Huebsch, PLLC

(57) ABSTRACT

Apparatuses and methods for data storage error protection are described. One example apparatus for data storage error protection includes an array of memory cells arranged in a first dimension and a second dimension. A controller is configured to determine a set of symbols corresponding to data stored in the memory cells. The controller is configured to add subsets of the set of symbols obliquely oriented to the first dimension and the second dimension to determine a number of parity check symbols. The controller is configured to use a same number of parity check symbols for protection of a first subset of memory cells oriented parallel to the first dimension as used for protection of a second subset of memory cells oriented parallel to the second dimension.

31 Claims, 8 Drawing Sheets

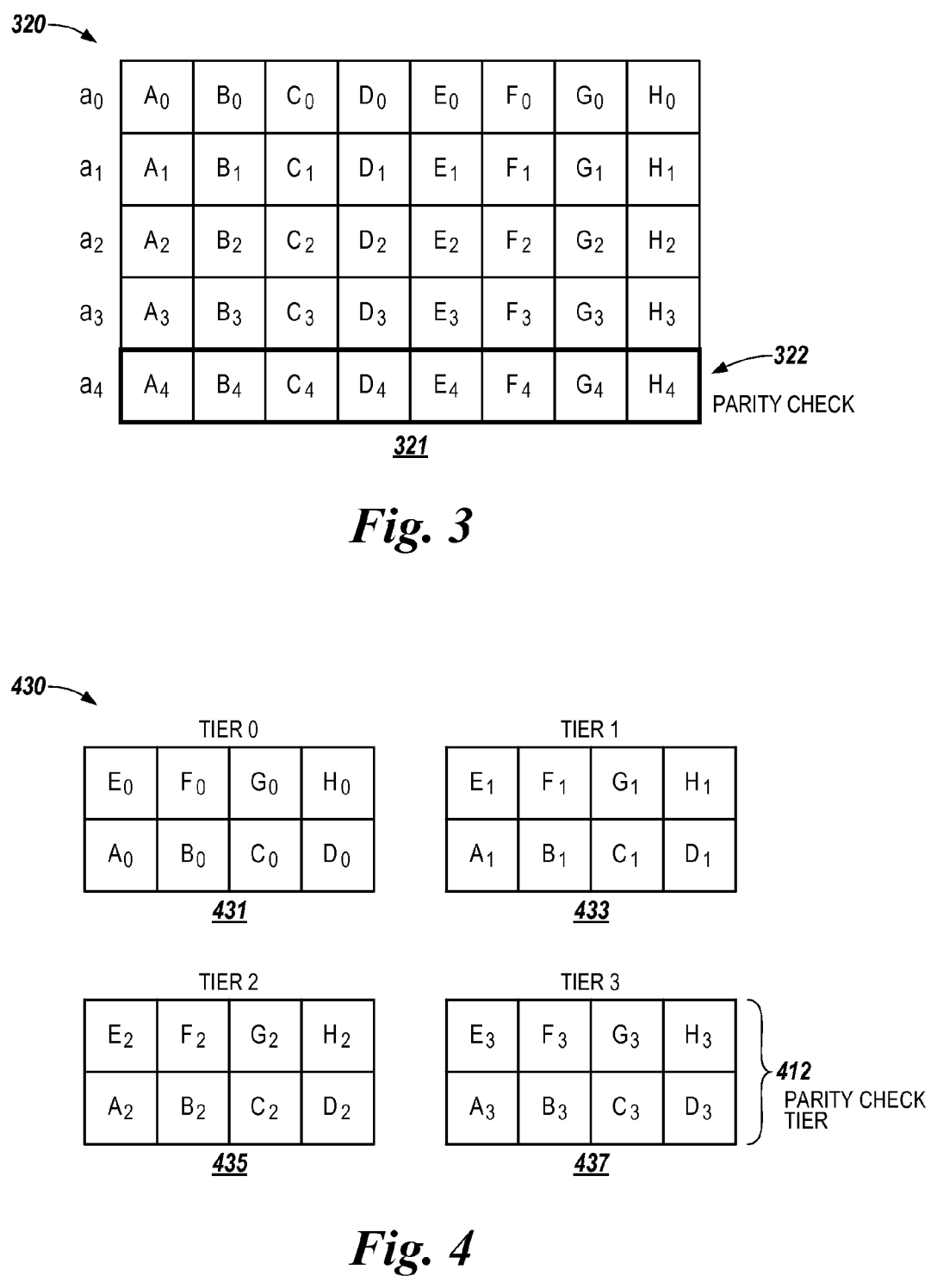

320

| | | | | | | | | |
|---|---|---|---|---|---|---|---|---|
| $a_0$ | $A_0$ | $B_0$ | $C_0$ | $D_0$ | $E_0$ | $F_0$ | $G_0$ | $H_0$ |
| $a_1$ | $A_1$ | $B_1$ | $C_1$ | $D_1$ | $E_1$ | $F_1$ | $G_1$ | $H_1$ |
| $a_2$ | $A_2$ | $B_2$ | $C_2$ | $D_2$ | $E_2$ | $F_2$ | $G_2$ | $H_2$ |
| $a_3$ | $A_3$ | $B_3$ | $C_3$ | $D_3$ | $E_3$ | $F_3$ | $G_3$ | $H_3$ |
| $a_4$ | $A_4$ | $B_4$ | $C_4$ | $D_4$ | $E_4$ | $F_4$ | $G_4$ | $H_4$ |

322 PARITY CHECK

TIER 0

| | | | |
|---|---|---|---|
| $E_0$ | $F_0$ | $G_0$ | $H_0$ |
| $A_0$ | $B_0$ | $C_0$ | $D_0$ |

431

TIER 1

| | | | |
|---|---|---|---|
| $E_1$ | $F_1$ | $G_1$ | $H_1$ |
| $A_1$ | $B_1$ | $C_1$ | $D_1$ |

433

TIER 2

| | | | |
|---|---|---|---|
| $E_2$ | $F_2$ | $G_2$ | $H_2$ |
| $A_2$ | $B_2$ | $C_2$ | $D_2$ |

435

TIER 3

| | | | |
|---|---|---|---|
| $E_3$ | $F_3$ | $G_3$ | $H_3$ |
| $A_3$ | $B_3$ | $C_3$ | $D_3$ |

437

412 PARITY CHECK TIER

*Fig. 4*

DATA STORAGE ERROR PROTECTION

TECHNICAL FIELD

The present disclosure relates generally to semiconductor memory devices and methods and, more particularly, to apparatuses and methods for data storage error protection.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and/or flash memory, among others.

Flash memory devices can be utilized as non-volatile memory for a wide range of electronic applications. Flash memory devices typically use a one-transistor memory cell that allows for high memory densities, high reliability, and/or low power consumption. Uses for flash memory include memory for solid state drives (SSDs), automotive applications, aeronautic applications, surveillance applications, personal computers, personal digital assistants (PDAs), digital cameras, cellular telephones, portable music players, e.g., MP3 players, and/or movie players, among other electronic devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to, and in some cases from, an access line, which is commonly referred to in the art as a "word line". However, each memory cell is not directly coupled to a sense line (which is commonly referred to as a "data line" or a "bit line" in the art) by its drain. Instead, the memory cells of the array are coupled together in series, source to drain, between a common source and a sense line, where the memory cells commonly coupled to a particular sense line are commonly referred to as a "column" or a "string" in the art.

Memory cells in a NAND array architecture can be programmed to a targeted, e.g., desired, program state. For example, electric charge can be placed on or removed from a charge storage structure, e.g., a floating gate or charge trap, of a memory cell to put the memory cell into one of a number of program states. For example, a single level cell (SLC) can be programmed to one of two program states, e.g., one bit, so as to represent a binary data value, e.g., "1" or "0", stored by the memory cell.

In a two-dimensional (2D) array of memory cells, some data storage errors may be managed by applicable error control techniques, e.g., such as redundant array of independent NAND (RAIN). However, such error control techniques may not be suitable for error control in, for instance, a 3D NAND architecture in which it is possible to have data storage errors in either tiers or pillars of memory cells.

BRIEF DESCRIPTION OF THE DRAWINGS

FIG. 3 is a representation of a parity check for a portion of a 2D array of memory cells.

FIG. 4 is a representation of a parity check tier for a portion of a 3D array of memory cells.

DETAILED DESCRIPTION

Figure 1:
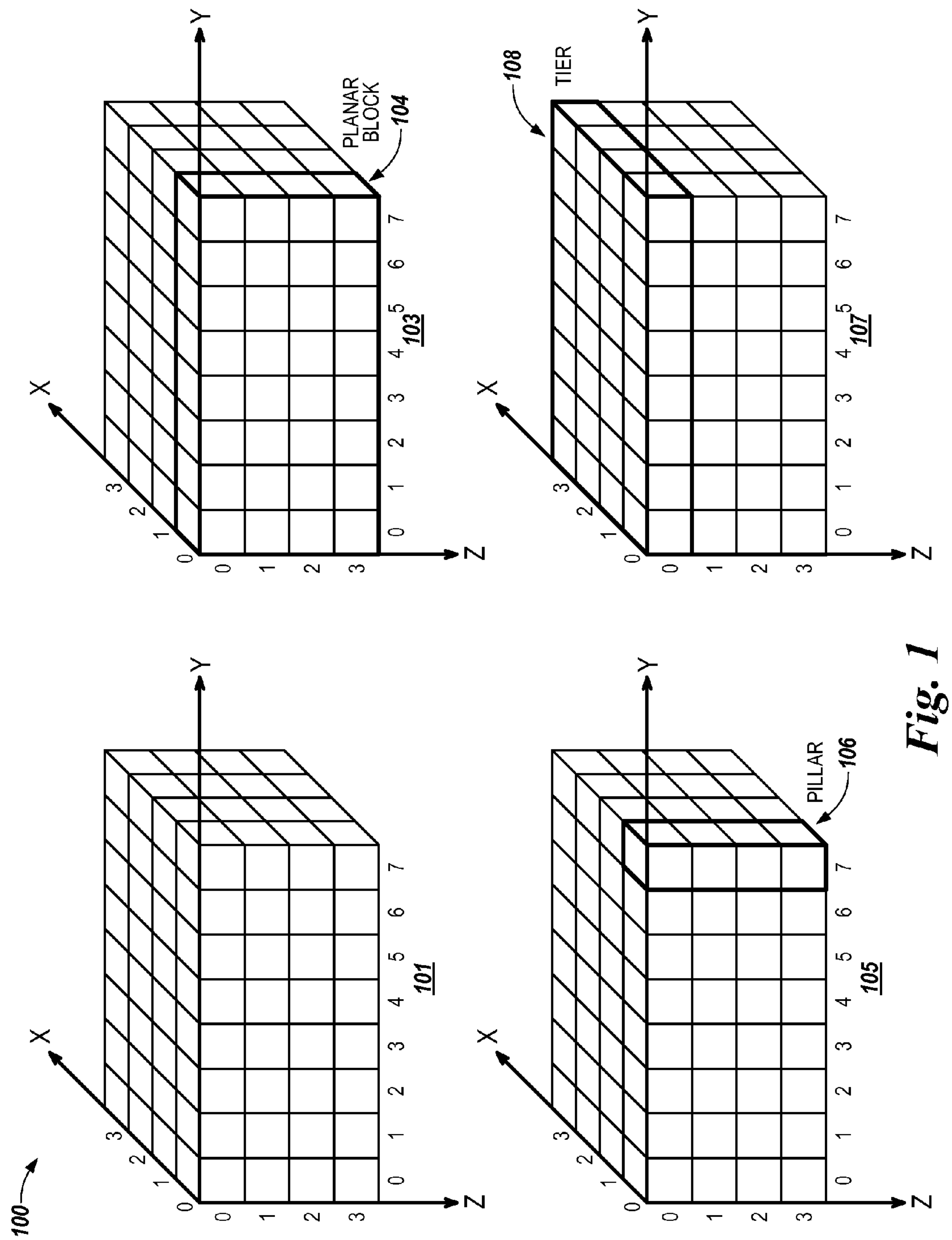
FIG. 1 is a schematic of a portion of a 3D array of memory cells in accordance with one or more embodiments of the present disclosure.

The present disclosure includes apparatuses and methods for data storage error protection. An example apparatus for data storage error protection includes an array of memory cells arranged in at least a first dimension and a second dimension. A controller is configured to determine a set of symbols corresponding to data stored in the memory cells. The controller is configured to add subsets of the set of symbols obliquely oriented to the first dimension and the second dimension to determine a number of parity check symbols. The controller is configured to use a same number of parity check symbols for protection of a first subset of memory cells oriented parallel to the first dimension as used for protection of a second subset of memory cells oriented parallel to the second dimension.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit corresponds to the figure number of the drawing and the remaining digits identify an element or component in the drawing. Similar elements or components between different figures may be identified by the use of similar digits. For example, 111 may reference element "11" in FIG. 1, and a similar element may be referenced as 211 in FIG. 2. As will be appreciated, elements shown in the various embodiments herein can be added, exchanged, and/or eliminated so as to provide a number of additional embodiments of the present disclosure. In addition, as will be appreciated, the proportion and/or the relative scale of the elements provided in the figures are intended to illustrate the embodiments of the present invention and should not be taken in a limiting sense.

FIG. 1 is a schematic of a portion of a 3D array of memory cells in accordance with one or more embodiments of the present disclosure. For purposes of illustration, the portion of the 3D array of memory cells 100 in FIG. 1 shows perspective views of various 3D combinations of memory cells. The X, Y, and Z dimensions of the 3D arrays can indicate orthogonally oriented dimensions of the 3D arrays, although embodiments of the present disclosure are not limited to the 3D arrays and/or memory cells therein being configured orthogonally. Moreover, embodiments of the present disclosure are not limited to 3D arrays and can include arrays of memory cells having any number of dimensions. For example, embodiments can include 2D arrays where a one memory cell deep plane of memory cells can be configured orthogonally or otherwise.

The perspective view of the portion of the 3D array of memory cells 101 illustrates that the portion can, for example, have an X dimension that has a sequence of four memory cells arranged into the plane of the page at positions 0, 1, 2, and 3, a Y dimension that has a sequence of eight memory cells arranged horizontally at positions 0, 1, 2, . . . , and 7, and a Z dimension that has a sequence of four memory cells arranged vertically at positions 0, 1, 2, and 3. The portion of the 3D array of memory cells 101 can be termed a block of memory cells. In some embodiments, the portion of the 3D memory array can be a block of non-volatile memory cells in a NAND architecture.

The perspective view of the portion of the 3D array of memory cells 103 illustrates that the portion can have a number of sub-blocks of memory cells. For example, a planar block 104 can be formed by including memory cells at position 0 that extend one memory cell into the plane of the page in the X dimension, the sequence of memory cells at positions 0, 1, 2, . . . , and 7 in the Y dimension, and the sequence of memory cells at positions 0, 1, 2, and 3 in the Z dimension. As such, the planar block 104 can be a YZ vertical planar sub-block that includes 4×8=32 memory cells.

The perspective view of the portion of the 3D array of memory cells 105 illustrates that the portion can have a number of pillars of memory cells. As shown in FIG. 1, a pillar 106 can be a vertical pillar, in the Z dimension, of memory cells. Pillars can be formed at any combination of positions in the X and Y dimensions. For example, the pillar 106 can be formed by including the memory cells at position 0 that extend one memory cell into the plane of the page in the X dimension and a vertical sequence of memory cells at position 7 in the Y dimension. As such, the pillar 106 can include a sequence of 1×4=4 memory cells extending vertically in the Z dimension. In some embodiments, the pillars can be organized in YZ planar blocks 104 and a plurality of such planar blocks can be combined to extend in the X dimension to form a block of memory cells 101.

In 3D NAND architecture, a pillar including a sequence of memory cells extending vertically in the Z dimension can be termed a NAND string. In various implementations, each NAND string can have a sequence that includes up to 32, 64, 128, or more NAND memory cells. A sequence of pillars extending in the X dimension, e.g., at positions 0, 1, 2, and 3 in the X dimension and at position 0 in the Y dimension, can be coupled to, e.g., share, a sense line in some embodiments. A sequence of pillars extending in the Y dimension, e.g., at position 0 in the X dimension and at positions 0, 1, 2, . . . , and 7 in the Y dimension, can be coupled to, e.g., share, a drain select gate (SGD) in some embodiments.

The perspective view of the portion of the 3D array of memory cells 107 illustrates that the portion can have a number of tiers of memory cells. As shown in FIG. 1, a tier 108 can be a horizontal plane, in the X and Y dimensions, of memory cells. Tiers can be formed at any position along the Z dimension for combinations of positions in the X and Y dimensions. For example, the tier 108 can be formed by including the sequence of memory cells at positions 0, 1, 2, and 3 that extends into the plane of the page in the X dimension, the horizontal sequence of memory cells at positions 0, 1, 2, . . . , and 7 in the Y dimension, and the memory cells at position 0 that extend one memory cell down in the Z dimension. As such, the tier 108 can be a XY horizontal planar sub-block that includes 4×8=32 memory cells. In some embodiments, the tiers can be organized as a plurality of such XY horizontal planar sub-blocks (tiers) that can be stacked to extend in the Z dimension to form a block of memory cells 101.

In 3D NAND architecture, memory cells in a same tier extending in the X dimension, e.g., at positions 0, 1, 2, and 3, and extending in the Y dimension, e.g., at positions 0, 1, 2, . . . , and 7, can be coupled to, e.g., share, an access line in some embodiments. A number of access lines can correspond to a number of memory cells in a single pillar, which also can correspond to a number of tiers of the 3D array.

Figure 2:
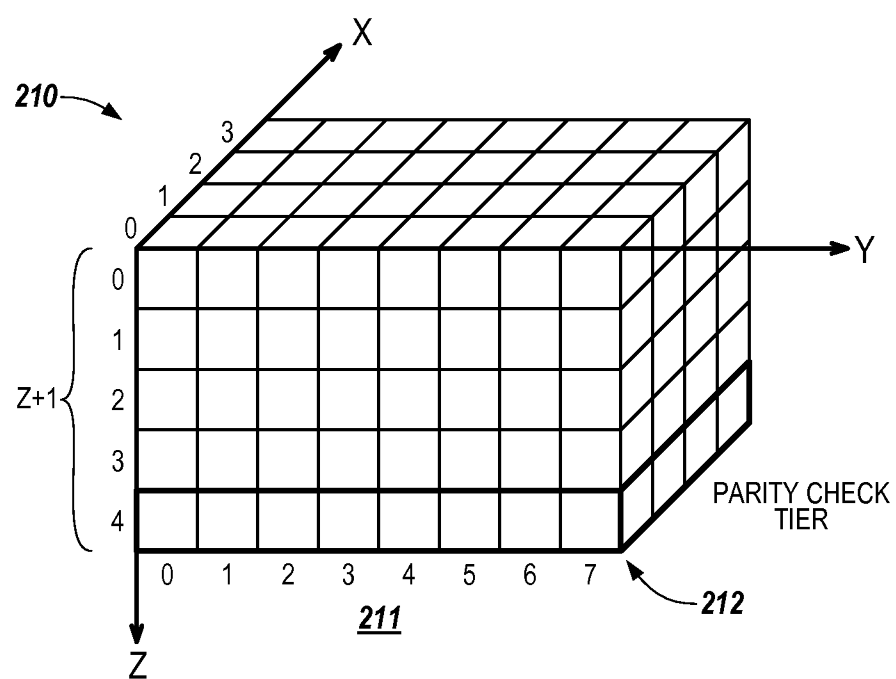
FIG. 2 is a schematic of a portion of a 3D array of memory cells with a parity check tier in accordance with one or more embodiments of the present disclosure.

FIG. 2 is a schematic of a portion of a 3D array of memory cells with a parity check tier in accordance with one or more embodiments of the present disclosure. For purposes of illustration, the portion of the 3D array 210 in FIG. 2 shows a perspective view of a 3D array of memory cells, such as that described in connection with FIG. 1. In addition to the tiers in the embodiments shown in FIG. 1, the 3D array 210 shown in FIG. 2 can include a parity check tier 212 of memory cells, as described further herein, added to the 3D array 210 on a side 211 that can correspond to an end of a data read sequence of memory cells in the Z dimension.

As such, the number of tiers, e.g., corresponding to tiers at positions 0, 1, 2, 3, and 4 in the Z dimension, such that Z=4, can be indicated by Z+1. That is, in some embodiments, there can be 5 tiers in the 3D array 210, including the parity check tier 212, in contrast to the 4 tiers 108 at positions 0, 1, 2, and 3 in the Z dimension in FIG. 1. In some embodiments, the parity check tier 212 can be included instead of another tier, e.g., as a replacement for the tier at position 3 in the Z dimension. The X, Y, and Z dimensions of the 3D array 210 can indicate orthogonally oriented dimensions of the 3D array, including the parity check tier 212, although embodiments of the present disclosure are not limited to the 3D arrays and/or memory cells therein being configured orthogonally.

FIG. 3 is a representation of a parity check for a portion of a 2D array of memory cells. Protecting data from data storage errors, e.g., due to problems with disks, dies, word line-to-word line shorts, etc., can, for example, be accomplished by erasure coding. An erasure is a data storage error in which a location of the data storage error is known, but the data value of the data storage error is not known, e.g., either 0 or 1 in binary data coding. An erasure code can add data to a memory system to enable correction of such data storage errors. For clarity, the embodiments described herein are discussed in the context of binary coded data and/or symbols, however, the techniques and/or equations presented herein are valid with other coding systems, e.g., decimal, etc.

For example, a stored set of data a can correspond to n symbols $a_0, a_1, \ldots, a_{n-i}$. To create an erasure code, additional data can be encoded to add to symbols $a_0, a_1, \ldots, a_{n-1}$ a check sum symbol $a_n$ as a parity check:

$$a_n=-\Sigma_{i=0}^{n-1}a_i \quad (1)$$

Adding the check sum symbol $a_n$ as the parity check to the n symbols $a_0, a_1, \ldots, a_{n-1}$ results in the total number of symbols being n+1. As such, if a data storage error occurs at a position $j\in\{0, \ldots, n\}$ in an array of memory cells, the data value for the data storage error can be recovered using the expression:

$$a_j=-\Sigma_{i=0(\neq j)}^{n}a_i \quad (2)$$

For m-bit binary symbols, e.g., $a_i=(a_{i,0}, a_{i,1}, \ldots, a_{i,m-1})$, where each $a_{i,k}$ can be a memory bit, a sum of the binary symbols can be determined by addition, e.g., using exclusive or (XOR) operations, that is, addition modulo 2. This can yield m parity check equations:

$$a_{n,k}=-\Sigma_{i=0}^{n-1}a_{i,k} \quad (3)$$

A representative result 320 of applying such a code is illustrated in FIG. 3 as a 2D erasure code able to correct a single data storage error (erasure) in each column of vertically aligned memory cells. In this example, m=8, which represents 8 columns of memory cells, as shown at A, B, . . . , and H, in a 2D array of memory cells. In addition, n=4, which represents 4 rows of memory cells for stored data, as shown at symbols $a_0$, $a_1$, $a_2$, and $a_3$. For each column, the vertically aligned symbols can be added, e.g., by an XOR operation, to yield a parity check symbol. For example, vertically aligned symbols $B_0$, $B_1$, $B_2$, and $B_3$ can be added to yield parity check symbol $B_4$. As such, an appropriate parity check symbol can be at the end of each vertically aligned column 321 as a row 322 of parity check symbols $a_4$.

FIG. 4 is a representation of a parity check tier for a portion of a 3D array of memory cells. A representative result 430 of the single-erasure correcting code described in connection with FIG. 3 is illustrated in FIG. 4 as extended to a 3D array of memory cells.

FIG. 4 represents separate top views of a sequence of tiers consistent with the perspective view 210 described in connection with FIG. 2. Each tier of tier 0 431, tier 1 433, and tier 2 435 represents a tier in the 3D array for storage of data in the memory cells thereof. Tier 3 437 can be added as a parity check tier 412. Each tier in FIG. 4 is shown to have 2 memory cells that extend in the X dimension and 4 memory cells that extend in the Y dimension. By stacking these tiers, 8 (2×4=8) vertically aligned memory cells in pillars can be formed, as shown at A, B, . . . , and H, in the 3D array of memory cells. Accordingly, the sizes of the dimensions of the memory cell array are: X=2; Y=4; and Z=3. With tier 3 437 being the parity check tier 412, the value of Z+1=4.

For each pillar, the vertically aligned symbols can be added, e.g., by an XOR operation, to yield a parity check symbol for the position of that pillar in the parity check tier 412. For example, vertically aligned symbols $A_0$, $A_1$, and $A_2$ can be added to yield parity check symbol $A_3$ in the parity check tier 412.

Such an extension of the single-erasure correcting code described in connection with FIG. 3 to the 3D array of memory cells illustrated in FIG. 4 may be able to recover a data storage error in each of the pillars, however, such an implementation is not configured to recover data storage errors in the tiers. Moreover, stacking the parity check implementation for the 2D array of memory cells described in connection with FIG. 3 to form a 3D array of memory cells, as illustrated in FIG. 4, may be able to recover data storage errors in each of the tiers, however, such an implementation is not configured to recover data storage errors in the pillars.

Figure 5:
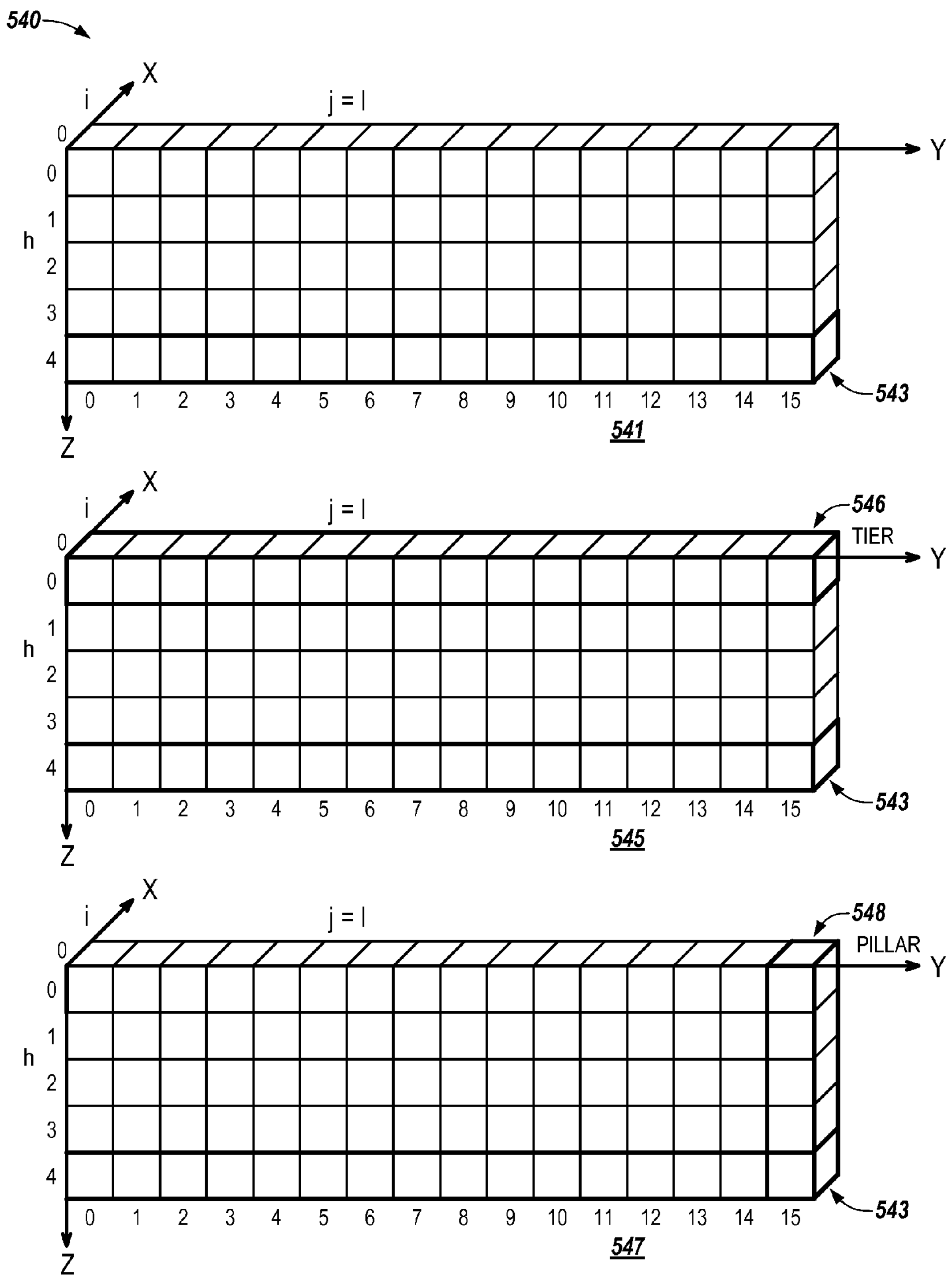
FIG. 5 illustrates a representation of a tier, a pillar, and a parity check tier for a planarized portion of a 3D array of memory cells in accordance with one or more embodiments of the present disclosure.

FIG. 5 illustrates a representation of a tier, a pillar, and a parity check tier for a planarized portion of a 3D array of memory cells in accordance with one or more embodiments of the present disclosure. Erasure coding to recover data storage errors is an active area of research, e.g., for cloud-based storage applications, among others. A focus of such research is development of erasure codes able to recover two or more types of data storage errors with efficient implementations that reduce complexity of coding and decoding algorithms and/or reduce volumes of data being analyzed, among other considerations.

Accordingly, the present disclosure describes apparatuses and methods for data storage error protection able to provide protection from data storage errors occurring both in memory cells oriented parallel to a first dimension and in memory cells oriented parallel to a second dimension, e.g., tiers and pillars that may be oriented orthogonally. Such protection can use the same number of parity check symbols for protection of the memory cells oriented parallel to the first dimension as used for protection of the memory cells oriented parallel to the second dimension.

As such, the same amount of parity check data is used to protect from data storage errors in both of the 2 dimensions, e.g., the tiers and pillars, as used for protection of one of the 2 dimensions, e.g., the amount of parity check data used to protect from data storage errors in the tiers. Concerning a 3D array of memory cells of size X×y×Z, e.g., as shown in FIG. 1, the present disclosure describes how parity check symbols can be determined, e.g., encoded, such that the information contained in any tier h, with $h\in\{0, \ldots, Z-1\}$, or any pillar (i, j), with $i\in\{0, \ldots, X-1\}$ and $j\in\{0, \ldots, Y-1\}$, can be recovered, e.g., decoded, when data storage errors occur in either a tier or a pillar. The encoded parity check symbols can be stored as a single set, as described herein, in a parity check tier, e.g., parity check tier 212 shown in FIG. 2.

FIG. 5 illustrates planarized views of a portion 540, e.g., a block, of a 3D array of memory cells. The planarization of the block shows addressing of the memory cells two dimensionally with two coordinates (l, h), where l is substituted for j, instead of three dimensionally with three coordinates (i, j, h). Planarized block 541 shows memory cells in an example of a parity check tier 543 at positions l0, l1, l2, . . . , and l15 in the Y dimension and at position h4 in the Z dimension. Being shown as planarized, the memory cells for storage of data and parity check symbols at positions l0, l1, l2, . . . , and l15 in the Y dimension and at positions h0, h1, h2, h3, and h4 in the Z dimension are shown only at i0 in the X dimension. Planarized block 545 shows memory cells in an example of a data storage tier 546 at positions l0, l1, l2, . . . , and l15 in the Y dimension and at position h0 in the Z dimension. Planarized block 547 shows memory cells in an example of a pillar 548 at position l15 in the Y dimension and at positions h0, h1, h2, h3, and h4 in the Z dimension. The memory cells of the pillar 548 at positions h0, h1, h2, and h3 can be used for data storage, whereas the memory cell at position h4 can be part of the parity check tier 543 used for storage of parity check symbols, as described herein.

Conversion between the 2D coordinates and the 3D coordinates can be performed using the following equations:

$$\text{Direct map: } l=iY+j \quad (4)$$

$$\text{Inverse map: } =\lfloor l/Y \rfloor \; e \; j=\langle l \rangle_Y \quad (5)$$

where i=0, . . . , X−1, j=0, . . . , Y−1, l=0, . . . , XY−1, h=0, . . . , Z (Z active data memory cells per pillar plus 1 parity check memory cell per pillar), and $\lfloor a \rfloor$ can be used as the greatest integer smaller than the real value a in a flooring operation. To contribute to the cyclical nature of the shift operation described herein, if $\langle N \rangle_q$ is the remainder of N modulo M, then $N=M\lfloor N/M \rfloor+\langle N \rangle_M$, where $\lfloor N/M \rfloor$ is the quotient of the division N: M and $\langle N \rangle_M$ is the remainder of the division N: M.

Figure 6:
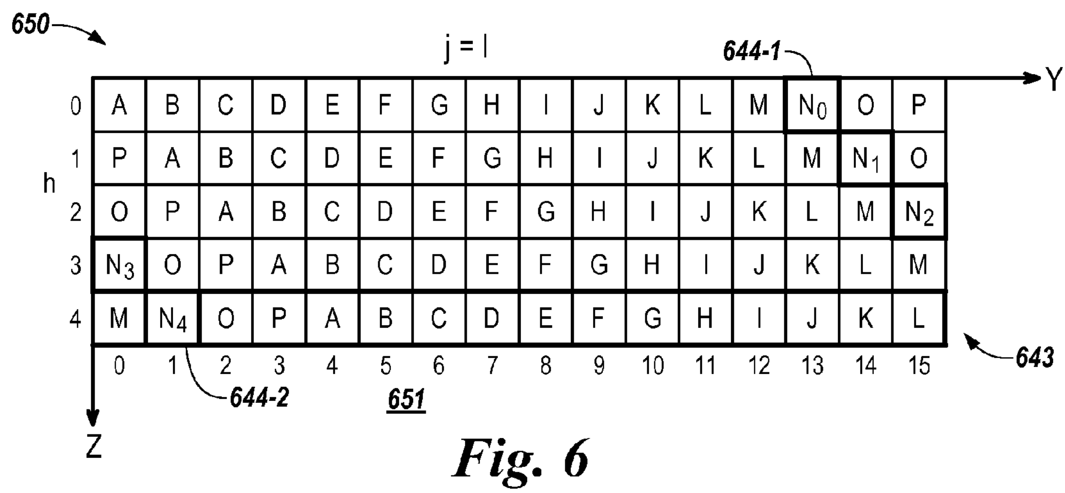
FIG. 6 illustrates a representation of a cyclic shift operation performed on stored data for a planarized portion of a 3D array of memory cells in accordance with one or more embodiments of the present disclosure.

FIG. 6 illustrates a representation of a cyclic shift operation performed on stored data for a planarized portion of a 3D array of memory cells in accordance with one or more embodiments of the present disclosure. Consistent with FIG. 5, FIG. 6 illustrates a planarized view of a portion 650, e.g., a block, of a 3D array of memory cells with addressing of the memory cells two dimensionally with two coordinates (l, h) instead of three dimensionally with three coordinates (i, j, h).

FIG. 3 shows the symbols corresponding to data sequences and the associated parity check symbols as being vertical aligned in columns. In contrast, FIG. 6 shows a representation of the symbols corresponding to data sequences and the associated parity check symbols as being stored in an oblique orientation relative to the Y and Z dimensions by a cyclic shift operation 651. Although positions h0, h1, h2, h3, and h4 in the Z dimension can be referred to as rows and positions l0, l1, l2, . . . , and l15 in the Y dimension can be referred to as columns in connection with the planarized view, they can represent tiers and pillars, respectively, in a 3D array.

As used herein, "oblique" and "obliquely" are intended to mean that the stored symbols corresponding to data sequences and the associated parity check symbols are not oriented parallel with or orthogonal to the first dimension, e.g., a row of memory cells in a 2D array or a pillar of memory cells in a 3D array, and are not oriented parallel with or orthogonal to the second dimension, e.g., a column of memory cells in a 2D array or a tier of memory cells in a 3D array. Rather, the stored symbols corresponding to data sequences and the associated parity check symbols are obliquely oriented to, e.g., stored at an angle relative to, two dimensions of a 2D array or at least two of three dimensions of a 3D array of memory cells, as described and shown in connection with FIGS. 6-9 of the present disclosure.

FIG. 6 shows the symbols being stored in the oblique orientation as a result of a cyclic shift right (CSR) operation. As shown in the planarized 2D view in FIG. 6, the CSR operation can shift each data bit, and as a result its corresponding symbol, to a memory cell in a next right position, e.g., in the Y dimension, in the same row of memory cells. If a data bit is at the end of a row, e.g., at position l15 in the Y dimension, the data bit can be shifted to the beginning, e.g., at position l0 in the Y dimension, of the same row. Each successive row h is shown with its data bits being shifted by a CSR operation relative to the preceding row.

For example, the symbol $N_0$ 644-1 at position l13 in the top row h0 is shifted one memory cell to the right $N_1$ to position l14 in the next row h1 in the Y dimension, then is shifted one more memory cell to the right $N_2$ to position l15 in the next row h2, where position l15 is the last memory cell in each row of the block 650. Accordingly, $N_3$ is next shifted to the first position l0 in the next row h3. The last shift 644-2 of the symbols corresponding to the data sequences and the corresponding parity check symbols in the planarized block 650 of the size (5×16 memory cells) shown in FIG. 6 is $N_4$ being shifted one memory cell to the right to position l1 in the next row h4, which is the parity check row 643. The cyclic shift operation just described is a CSR operation, however, embodiments of the present disclosure are not so limited. For example, a similar cyclic shift left operation could be performed and/or data bits and corresponding symbols could be shifted more than one memory cell in a particular direction each cyclic shift, among other possibilities.

As such, the parity check symbol $N_4$ 644-2 for the N sequence of symbols to be encoded in the parity check row 643 can be determined by addition, e.g., using an XOR operation, of the symbols corresponding to the stored data values:

$$N_4=N_0+N_1+N_2+N_3 \tag{6}$$

The 2D planar coordinates l, h described in connection with FIG. 5 can be used to represent positions of the symbols in a planarized block array A, e.g., planarized block array 650 shown in FIG. 6, such that the parity check symbol A, e.g., corresponding to $N_4$ 644-2 in FIG. 6, can be determined by:

$$A_{1,4}=A_{13,0}+A_{14,1}+A_{15,2}+A_{0,3} \tag{7}$$

The planarized block array A can be converted to a 3D block array. For example, columns at positions l8, l9, . . . , and l15 in the Y dimension can be moved in the X dimension behind columns at positions l0, l1, . . . , and l7 to result in two successive planes of columns at positions l0, l1, . . . , and l7. As such, X=2, Y=8, and the number of columns, e.g., pillars, in the 3D block array is XY=16.

By the conversion described in connection with FIG. 5, the 2D planar coordinates l, h can be converted to 3D coordinates i, j, h such that the parity check symbol A, e.g., corresponding to $N_4$ 644-2 in FIG. 6, can be determined by:

$$A_{0,1,4}=A_{1,5,0}+A_{1,6,1}+A_{1,7,2}+A_{0,0,3} \tag{8}$$

Such determinations are enabled when the number of rows in the 2D planar representation of the block does not exceed the number of columns, e.g., Z+1≤XY, so that each parity check symbol is a sum of symbols that are positioned in rows and columns different from the rows and column positions of symbols used to sum other parity check symbols. When this condition is satisfied, each parity check symbol equation intersects each set of i, j, and h coordinates only once such that symbols corresponding to a data value for each of the pillar—tier intersections are used only once. As such, a minimum distance is 2 with respect to tiers and pillars, in that every non-null codeword has at least 2 non-null tiers or at least 2 non-null pillars. Because the minimum distance of the codeword is 2, it is possible to correct a single data storage error in either a pillar or a tier.

As used herein, a code is a set of codewords. In the block code described herein, each codeword can be a sequence of a fixed number of elements. For example, a 3D array of memory cells can be formed with 16 planar blocks, e.g., planar block 104 in FIG. 1, such that X=16, and with 32 tiers, such that Z=32. Thus, any Y≥3 would satisfy the above condition. For instance, Y can be 8, with the resulting code having a size of 16×8×32. The code would be able to provide protection from a data storage error in the 32 tiers and a data storage error in the 16×8=128 pillars.

The additional parity check tier can, in various embodiments, be a physically contiguous tier and/or a logical tier (e.g., a coupled remote memory block dedicated to storage of parity check symbols). As previously described, adding a parity check tier to a 3D array of Z tiers can result in Z+1 tiers. In some embodiments, the total number of tiers can remain at, for example, Z=32 tiers by using 31 tiers for data storage and additional tier 32 for the encoded parity check symbols.

Figure 7:
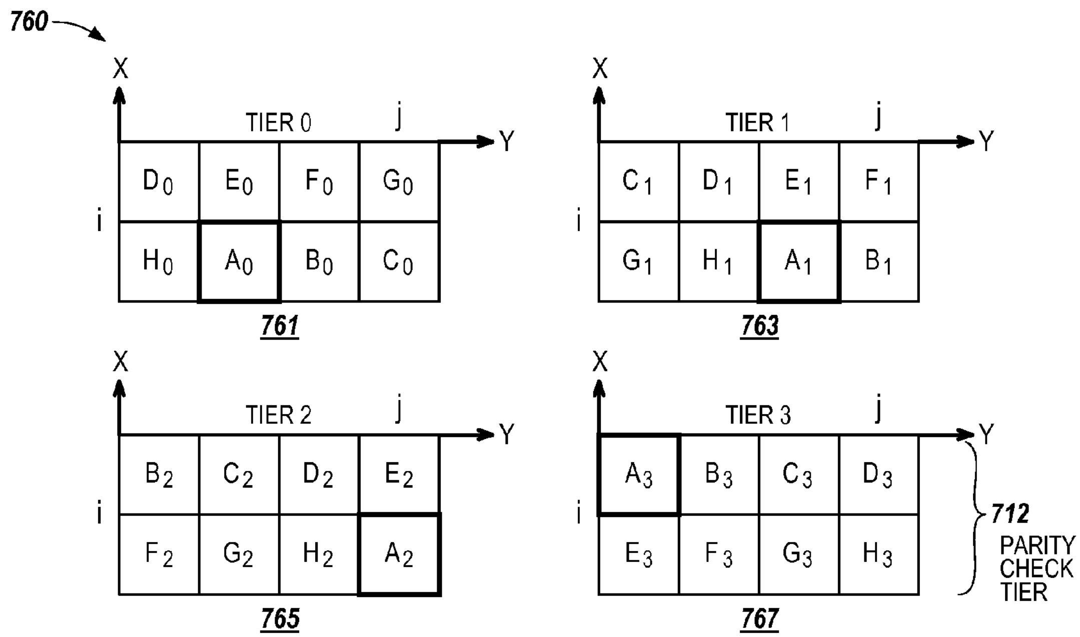
FIG. 7 illustrates a representation of a cyclic shift operation performed on stored data in successive tiers of a portion of a 3D array of memory cells in accordance with one or more embodiments of the present disclosure.

FIG. 7 illustrates a representation of a cyclic shift operation performed on stored data in successive tiers of a portion of a 3D array of memory cells in accordance with one or more embodiments of the present disclosure. The representation of the cyclic shift operation performed on the stored data and the corresponding symbols shows that the portion 760, e.g., a block, of the 3D array can have Z tiers for data storage, e.g., tier 0 761, tier 1 763, and tier 2 765. The block 760 is shown to have tier 3 767 as a parity check tier 712, for a total of Z+1=4 tiers. Each letter A, B, . . . , and H corresponds to a symbol representing a different sequence of stored data that is associated with a different equation for a parity check symbol, e.g., $A_3=A_0+A_1+A_2$, to be encoded e.g., stored, in the parity check tier 712. The i and j coordinates in the X dimension and the Y dimension, respectively, of each tier can be used to indicate positions of data values and/or corresponding parity symbols in each tier, as described in connection with FIG. 6.

Determination, e.g., coding, of a parity check symbol for the parity check tier 712 can, for example, be performed for a sequence of data $a=(a_0, a_1, \ldots, a_{Z-1})$, where each ah is a tier in which a data value for the sequence of data is stored and $a_Z$ is the parity check tier 712. For binary symbols, the sum can be determined by an XOR operation on CSR shifted data values and/or corresponding symbols, as described herein.

For example, the block 760 in FIG. 7 shows tier 0 761, tier 1 763, and tier 2 765 for data storage and tier 3 767 as the parity check tier 712. Accordingly, a parity check symbol $A_3$ for the sequence of data $a=(a_0, a_1, \ldots, a_{Z-1})$ can be determined by $A_3=A_0+A_1+A_2$ and the parity check symbol $B_3$ for the sequence of data $b=(b_0, b_1, \ldots, b_{Z-i})$ can be determined by $B_3=B_0+B_1+B_2$, and so on through sequence of data $h=(h_0, h_1, \ldots, h_{Z-i})$. As shown in tiers 761, 763, 765, and 767, each letter A, B, . . . , and H representing a different sequence of stored data is at a different position in each of the tiers as a result of the CSR operation performed thereon.

A tier by tier computation of the parity check symbols for the parity check tier $a_Z$ can be performed by:

```
a_Z = 0                                  (9)
For h = 0: Z - 1
        a_Z = a_h + a_Z
        a_Z = CSR (a_Z)
EndFor
```

Where there are 4 total tiers and the determined, e.g., stored, symbols in the parity check tier are represented by $a_3$, the computation can be performed as follows. At the start, symbols stored in the parity check tier 712 in positions corresponding to A, B, . . . , and H can be represented by:

$$a_3^{(0)}=[0\ 0\ 0\ 0\ 0\ 0\ 0\ 0] \tag{10}$$

After a first operation of reading tier 0 761 and applying CSR:

$$a_3^{(1)}=[C_0\ D_0\ E_0\ F_0\ G_0\ H_0\ A_0\ B_0] \tag{11}$$

After a second operation of reading tier 1 763 and applying CSR:

$$a_3^{(2)}=[B_0+B_1\ C_0+C_1\ D_0+D_1\ E_0+E_1\ F_0+F_1\ G_0+G_1\ H_0+H_1\ A_0+A_1] \tag{12}$$

After a third operation of reading tier 2 765 and applying CSR, the symbols to be encoded and stored in tier 3 767 as the parity check tier 712 are:

$$a_3=a_3^{(3)}=[A_0+A_1+A_2\ B_0+B_1+B_2\ C_0+C_1+C_2\ D_0+D_1+D_2\ E_0+E_1+E_2\ {}_0+F_1+F_2\ G_0+G_1+G_2\ H_0+H_1+H_2] \tag{13}$$

Accordingly, an equation for computing the parity check symbols for a 2D planar representation of a block A with coordinates l, h, as shown in FIGS. 5 and 6, can be:

$$a_{l,Z}=\Sigma_{h=0}^{Z-1} a\langle_{l-Z+h}\rangle_{XY,h} \tag{14}$$

where l=0, . . . , XY−1. An equivalent equation for computing the parity check symbols for a 3D representation of block A with coordinates i, j, h, as shown in FIG. 7, can be:

$$a_{i,j,z} = \sum_{h=0}^{Z-1} a_{\left\langle i+\left\lfloor \frac{j-Z+h}{Y} \right\rfloor \right\rangle_X, \langle j-Z+h \rangle_Y, h} \tag{15}$$

where l=0, . . . , XY−1, j=0, . . . , Y−1, ⌊•⌋ indicates the flooring operation described in connection with equation 5, and $\langle \alpha \rangle_\beta=\gamma$ if and only if $\gamma=\alpha \bmod \beta$ as a description of the remainder operation described in connection with equation 5.

Operations to recover data storage errors can be performed separately for tiers and pillars in a 3D array of memory cells. Recovery of all the data values and/or the corresponding symbols in a tier for a tier data storage error can be performed as follows, where t is the recovered tier data values and/or corresponding symbols, e.g., a row vector, and $h_t$ is a pillar address of the symbols to be recovered:

```
t = 0                                    (16)
For h = 0: Z
        If h ≠ h_t
                t = a_h + t
        EndIf
        t = CSR (t)
EndFor
For h = 0: (XY - (Z + 1) - h_t)
        t = CSR(t)
EndFor
a_ht = t
```

Recovery of symbols for pillar data storage errors can be performed consistent with the just described recovery operation for tiers. Correct addresses for the data values and/or corresponding symbols enable linking the appropriate symbols together for the parity check equations, e.g., equations 6-8 shown above in connection with FIG. 6.

Recovery of all the data values and/or the corresponding symbols in a pillar for a pillar data storage error can be performed as follows, where p is the recovered pillar data values and/or corresponding symbols, e.g., a column vector of Z+1 elements, and $(i_c, j_c)$ is the address of the pillar:

(17)

$p = 0$

For $h = 0$: $Z$

For $k = 0$: $Z$, $k \neq h$ $p(k) = p(k) + a_{\left\langle i+\left\lfloor \frac{j_c+h-k}{Y} \right\rfloor \right\rangle_X, \langle j_c+h-k \rangle_Y, h}$

*Endfor*

*Endfor*

$a_{ic,jc,} := p$

Progressing through the block tier by tier, the data values and/or the corresponding symbols linked together by the parity check equations can be determined along with the correct positions of p, that is, the positions of the pillar data values and/or corresponding symbols to be recovered. Each time a row i is addressed for a recovery operation for pillar ($i_c$, $j_c$), the j data values and/or corresponding symbols that are relevant to the Z data values and/or corresponding symbols to be recovered can be collected for the pillar having the data storage error.

Figure 8:
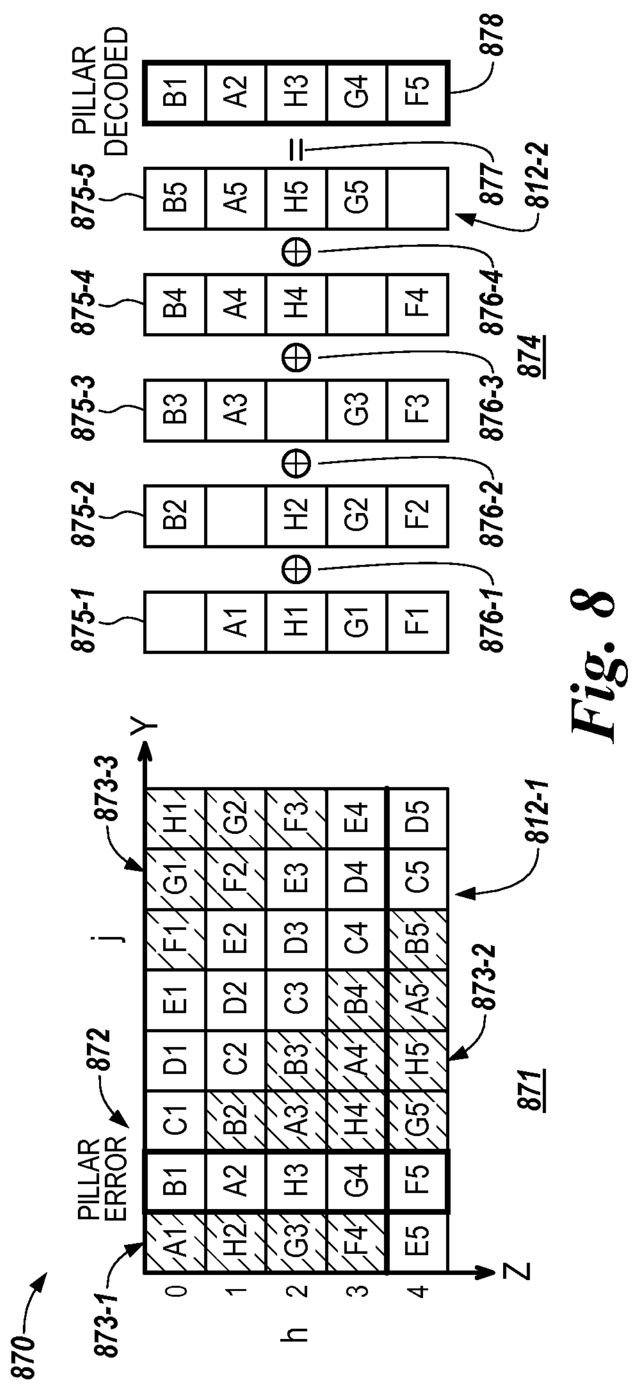
FIG. 8 illustrates a representation of a pillar recovery operation performed for a portion of a 3D array of memory cells in accordance with one or more embodiments of the present disclosure.

FIG. 8 illustrates a representation of a pillar recovery operation performed for a portion of a 3D array of memory cells in accordance with one or more embodiments of the present disclosure. As illustrated in FIG. 8, the pillar recovery operation 870 can include the correlation of the collected data values and/or corresponding symbols 871 with appropriate parity check symbols to enable recovery 878, e.g., decoding, of all the data values and/or corresponding symbols for a pillar 872 with the data storage error.

For example, the pillar 872 with the data storage error can be positioned at i=0 in the X dimension and at j=1 in the Y dimension and the pillar 872 can include a sequence of memory cells extending vertically in the Z dimension through five tiers h=($h_0$, $h_1$, $h_2$, $h_3$, $h_4$). As a result of performance of a CSR operation, the sequences of data values and/or corresponding symbols that would have been vertically aligned in the pillars, e.g., $B_1$, $B_2$, $B_3$, $B_4$, and $B_5$, become obliquely oriented to, in this example, the Y dimension and the Z dimension. For example, whereas $B_1$ is in the pillar 872 with the data storage error at $j_1$, $h_0$, in the next tier $h_1$, $B_2$ is shifted one pillar the right at $j_2$, $h_1$ and the sequence of data values and/or corresponding symbols is shifted one pillar to the right in each of the successive tiers until the parity check symbol $B_5$ for the sequence is positioned at $j_5$, $h_4$ in the parity check tier 812-1. As such, the pillar 872 would have the sequence of symbols $B_1$, $A_2$, $H_3$, $G_4$, and $F_5$ had there not been the data storage error for that pillar.

For the pillar 872 with the data storage error, the data values and/or corresponding symbols can be recovered 878, e.g., decoded, with a pillar recovery operation 870 that uses tier by tier reading and correlation 874 of sequences of data values and/or corresponding symbols obtained from those previously collected 871. For example, a data storage error for $B_1$ 875-1 can be recovered by tier by tier reading of tiers $h_0$, $h_1$, $h_2$, $h_3$, and $h_4$ and correlation of the obliquely oriented $B_2$ 875-2, $B_3$ 875-3, $B_4$ 875-4, and $B_5$ 875-5, which is the parity check symbol in the parity check tier 812-2, with the data storage error for $B_1$ 875-1. Similar correlations can be used for recovery of other pillar data storage errors. For example, a correlation of $A_1$, $A_3$, $A_4$, and $A_5$ through a correlation of $F_1$, $F_2$, $F_3$, and $F_4$ can be used to recover the data storage errors for $A_2$ 875-2, $H_3$ 875-3, $G_4$ 875-4, and $F_5$ 875-5.

As described herein, the data values and/or corresponding symbols for the data storage errors for $B_1$ 875-1, $A_2$ 875-2, $H_3$ 875-3, $G_4$ 875-4, and $F_5$ 875-5 can be recovered by addition of the corresponding collected B, A, H, G, and F data values and/or corresponding symbols. For example, the addition can be performed using an XOR operation sequentially 876-1, 876-2, 876-3, 876-4 that yields 877 the recovery 878, e.g., decoding, of one or all of the data values and/or corresponding symbols $B_1$, $A_2$, $H_3$, $G_4$, and $F_5$ for the pillar 872 with the data storage error. As such, the data values and/or the symbols corresponding to the data values originally stored in memory cells of the pillar 872 having the data storage error can be recovered whether it is the sequence of stored data or the parity check symbol.

As illustrated in the collected data values and/or corresponding symbols 871, the XOR operation can be performed on symbols corresponding to a subset of the symbols in each successive tier $h_0$, $h_1$, $h_2$, $h_3$, and $h_4$ of the 3D array, which includes the tier of parity check symbols 812-1. The subsets can correspond to a subset of the sequences of stored data and/or corresponding symbols originally stored in memory cells of the pillar 872 with the data storage error. For example, because $B_1$, $A_2$, $H_3$, $G_4$, and $F_5$ indicates the cyclic shifted sequence in pillar 872, data and/or corresponding symbols from sequences C, D, and E can be excluded from the collection and correlation 874 of sequences of data values and/or corresponding symbols. As such, only obliquely oriented subsets 873-1, 873-2, 873-3 representing data and/or corresponding symbols from sequences A, B, F, G, and H are collected for correlation 874 of sequences of data values and/or corresponding symbols. Hence, an amount of transferred data used for the pillar recovery operation 870 can be reduced.

Figure 9:
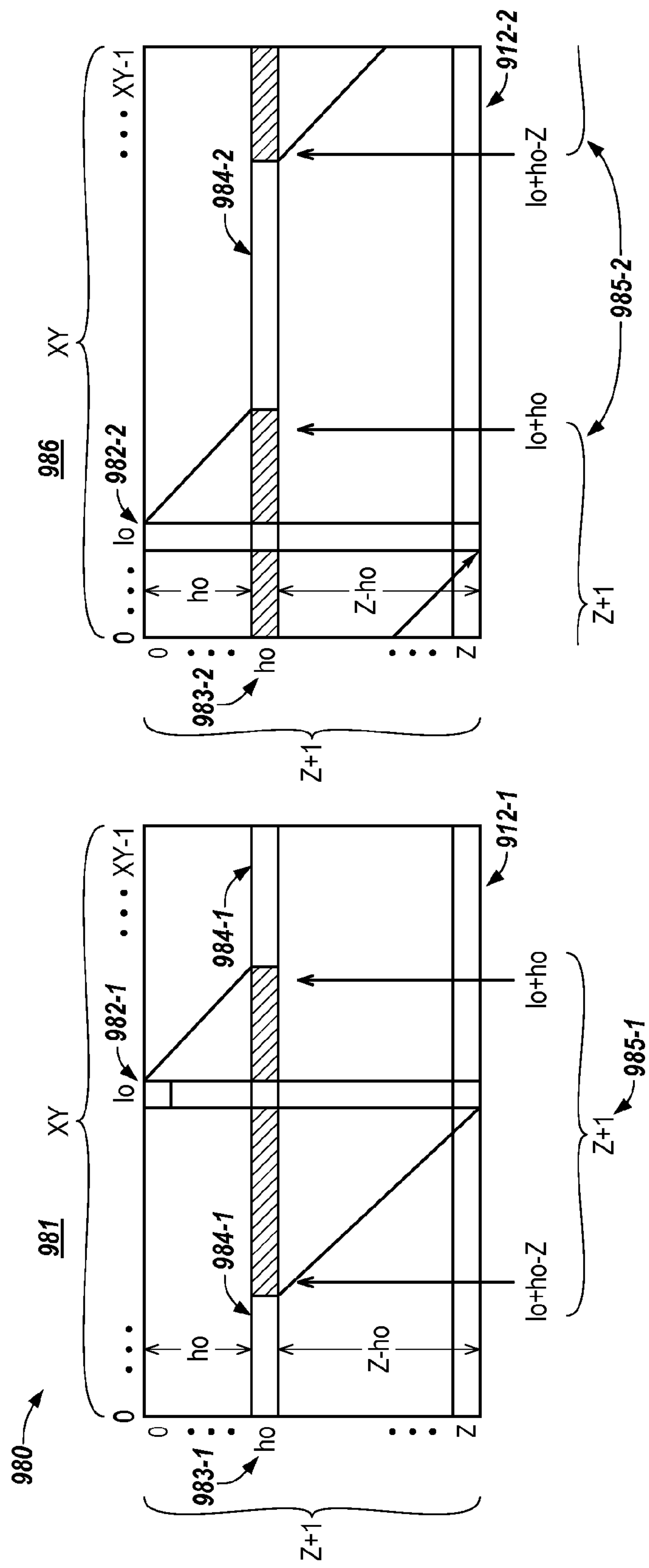
FIG. 9 is an illustration of a technique for a 3D array pillar recovery operation in accordance with one or more embodiments of the present disclosure.

FIG. 9 is an illustration of a technique for a 3D array pillar recovery operation in accordance with one or more embodiments of the present disclosure. FIG. 9 illustrates a graphical representation 980 of determining sizes of the subsets of data and/or corresponding symbols to be included and/or excluded in the correlation 874 of sequences of data values and/or corresponding symbols shown in FIG. 8. The graphical representation 980 is based upon a 2D representation with planar coordinates l, h of a 3D array with coordinates i, j, h, as described in connection with FIGS. 5-7. The placement and/or the size of the included and/or excluded subsets of data and/or corresponding symbols along a horizontal axis representing the planarized XY pillar positions can be determined by a position of a pillar 982 with a data storage error along the axis and/or a number of tiers Z+1 in the block of the 3D array of memory cells.

In graph 981, the pillar 982-1 with the data storage error is shown as positioned near a center position of the horizontal axis representing the planarized XY pillar positions. The number of pillar positions XY exceeds the number of tiers Z+1 to satisfy the condition that $Z+1 \leq XY$, so that each parity check symbol is a sum of symbols that are positioned in rows and columns different from the rows and column positions of symbols used to sum other parity check symbols. A position of a representative tier $h_0$ from among the Z+1 tiers can be used to determine the placement and/or the size of the included and/or excluded subsets of data and/or corresponding symbols. At the position 983-1 of tier $h_0$ and the position $l_0$ of the pillar 982-1 with the data storage error in graph 981, determining a rightward shift, caused by the CSR operation, of a position at a top of the pillar 982-1 along the horizontal axis and a leftward shift of a position at a bottom of the pillar 982-1 can result in a display of the placement and/or the size of the included and/or excluded subsets of data and/or corresponding symbols relative to the number of pillar positions XY. As shown in graph 981, the bottom of the pillar 982-1 is positioned in the parity check tier 912-1.

As such, the pillar 982-1 with the data storage error at the position 983-1 of tier $h_0$ along the vertical axis and position $l_0$ along the horizontal axis displays an included subset of positions 985-1 with size Z+1, which corresponds to the Z+1 number of tiers, and an excluded subset of positions 984-1, with a size equaling the remainder of the positions, e.g., XY−Z+1. Changing the position 983-1 of the representative tier $h_0$ upwards or downwards from 0 to Z can change the positions of the included subset 985-1 and the excluded subset 984-1 but not their relative sizes.

In graph 986, the pillar 982-2 with the data storage error is shown as positioned near a left end of the horizontal axis representing the planarized XY pillar positions. At the position 983-2 of tier $h_0$ and the position $l_0$ of the pillar 982-2 with the data storage error in graph 986, determining a rightward shift, caused by the CSR operation, of a position at a top of the pillar 982-2 along the horizontal axis results in the included subset 985-2 ending toward the center position of the horizontal axis representing the planarized XY pillar positions. However, the leftward shift of a position at the bottom of the pillar 982-2 can result in the included subset extending past the left end of the horizontal axis representing the planarized XY pillar positions.

Analogous to what is shown at 873-1 and 873-3 in FIG. 8, results of the CSR operation can cause the included set to be continued to be displayed extending inward from the right end of the horizontal axis. As such, the excluded subset 984-2 is displayed near the center position of the horizontal axis. As described in connection with graph 981, the pillar 982-2 in graph 986 with the data storage error at the position 983-2 of tier $h_0$ along the vertical axis and position $l_0$ along the horizontal axis displays an included subset of positions 985-2 with size Z+1, which corresponds to the Z+1 number of tiers, and an excluded subset of positions 984-2, with a size equaling the remainder of the positions, e.g., XY−Z+1. Changing the position 983-2 of the representative tier $h_0$ upwards or downwards from 0 to Z can change the positions of the included and excluded subsets but not their relative sizes.

Figure 10:
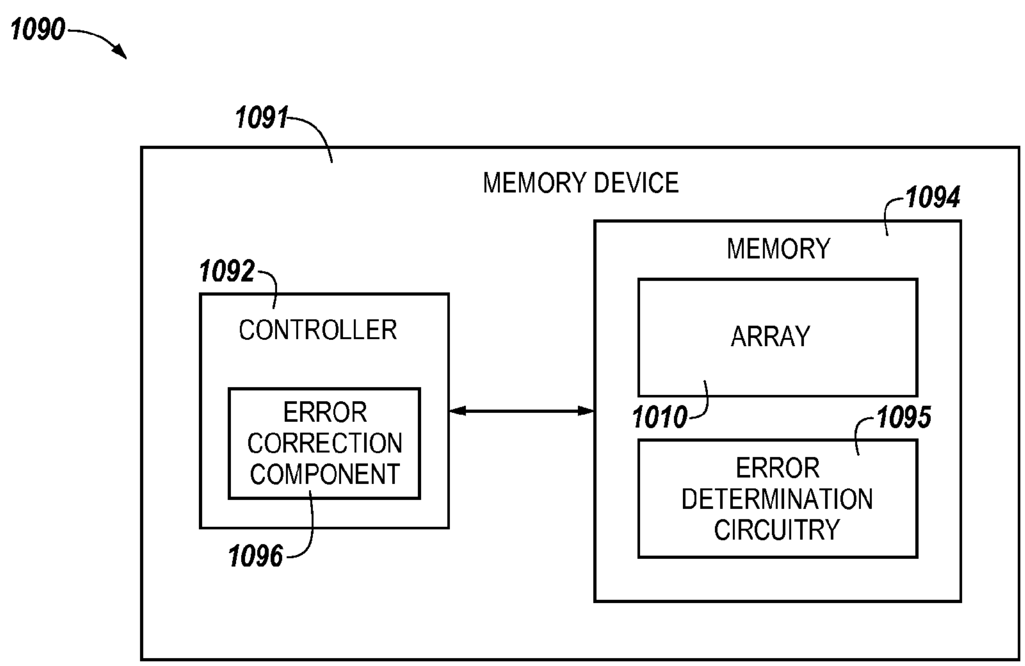
FIG. 10 illustrates a block diagram of an apparatus in the form of a memory device in accordance with one or more embodiments of the present disclosure.

FIG. 10 illustrates a block diagram of an apparatus in the form of a memory device in accordance with one or more embodiments of the present disclosure. As used herein, an apparatus 1090 can refer to, but is not limited to, any of a variety of structures or combinations of structures, such as a circuit or circuitry, a die or dice, a module or modules, a device or devices, or a system or systems, for example.

A memory device 1091 can be coupled to, e.g., connected to, and can communicate information with, a host that is not shown in FIG. 10 for clarity and so as not to obscure embodiments of the present disclosure. The host can include a memory access device, e.g., a processor. A processor can, as used herein, include a number of processors, such as a parallel processing system, a number of coprocessors, etc. Example hosts can include personal laptop computers, desktop computers, digital cameras, digital recording and playback devices, mobile, e.g., smart, phones, PDAs, memory card readers, interface hubs, and the like.

As shown in FIG. 10, the memory device 1091 can include a controller 1092 coupled to a memory 1094. The controller 1092 can include, for example, control circuitry and/or logic, e.g., hardware and/or firmware. For instance, controller 1092 can include an error correction component 1096. The error correction component 1096 can be configured to perform, in combination with at least one processor, the functions and/or equations presented herein related to data storage error protection. For example, the error correction component 1096 can be configured, as described herein, to store data using a cyclic shift operation, e.g., CSR, as described in connection with FIGS. 5-7, and to provide data storage error protection by an ability to recover, e.g., decode, the data storage error, e.g., for tiers and pillars of a 3D array, as described in connection with FIGS. 7-9.

The controller 1092 can be included on the same physical device, e.g., the same die, as memory array 1010, or can be included on a separate physical device that is communicatively coupled to the physical device that includes memory 1094. In a number of embodiments, components of the controller 1092 can be spread across multiple physical devices as a distributed controller, e.g., some components on the same die as the memory and some components on a different die, module, and/or board.

As shown in FIG. 10, memory 1094 can include a memory array 1010. The memory array 1010 can be, for example, a 3D memory array 210 previously described in connection with FIG. 2. Although one memory array is shown in FIG. 10, embodiments of the present disclosure are not so limited. That is, the memory device 1091 can include more than one memory array coupled to the controller 1092.

In the example illustrated in FIG. 10, the memory 1094 can include error determination circuitry 1095. That is, the error determination circuitry 1095 can be included on the same physical device, e.g., the same die, as the memory 1094. That is, the error determination circuitry 1095 can be included on the same die as the array 1010. Including the error determination circuitry 1095 in the memory 1094 can reduce the complexity and/or increase the performance (e.g., increase the speed, increase the reliability, and/or decrease the power consumption) of memory device 1091. However, embodiments of the present disclosure are not so limited. For example, in a number of embodiments, the error determination circuitry 1095 may be included in the controller 1092 instead of the memory 1094.

The error determination circuitry 1095 can be used to perform an error detection operation associated with the memory 1094. The error detection operation can, in various instances, be performed by a device that determines whether a data storage error has occurred and whether the data storage error is located in a particular row and/or column of a 2D memory array or a particular tier and/or pillar of a 3D memory array. For example, the controller 1092 can initiate the error detection operation by directing performance of a sense operation by the error determination circuitry 1095 to sense the data stored in the array 1010.

In one or more embodiments, an apparatus, as described herein, can include an array of memory cells arranged in at least a first dimension and a second dimension. In various embodiments, the first dimension can be a row in an X dimension and the second dimension can be a column in a Y dimension of a 2D array, e.g., as shown in FIG. 3, or the first dimension can be a row in an X dimension and the second dimension can be a column in a Y dimension of a 3D array, which define pillars, and a third dimension can be a Z dimension, which defines tiers of the 3D array, e.g., as shown in FIG. 1-2.

The apparatus can include a controller 1092. The controller 1092 can be configured to determine a set of symbols corresponding to data stored in the memory cells, e.g., as described in connection with FIGS. 3-4. The controller 1092 can be configured to add subsets, e.g., corresponding to individual sequences of the stored data in rows, columns, tiers, and/or pillars of the array, of the set of symbols obliquely oriented to at least the first dimension and the second dimension to determine a number of parity check symbols, e.g., as described in connection with FIGS. 6-7. The controller 1092 can be further configured to use the same number of parity check symbols for protection of a first subset of memory cells oriented parallel to the first dimension, e.g., a row in a 2D array or a pillar in a 3D array, as used for protection of a second subset of memory cells oriented parallel to the second dimension, e.g., a column in a 2D array or a tier in a 3D array.

In some embodiments, the first subset of memory cells can be a column of memory cells and the second subset of memory cells can be a row of memory cells in a 2D plane of the array, as described in connection with FIGS. 1 and 5-6. In some embodiments, the first subset of memory cells can be a pillar of memory cells and the second subset of memory cells can be a tier of memory cells in a 3D array of memory cells, as described in connection with FIGS. 1-2, 4, and 7.

The controller can further be configured to determine a location of a data storage error with an error detection operation performed, e.g., by error determination circuitry described in connection with FIG. 10, on data stored in the 3D array. The controller can further be configured to selectably perform, based at least in part on the same number of parity check symbols for each, an error recovery operation for the data storage error either in a pillar of memory cells or in a tier of memory cells of the 3D array. The error determination circuitry that performs the error detection operation, as directed by the controller, can be coupled to memory of the 3D array, the location of the data storage error can be sent to the controller, and the error recovery operation can be performed by the controller.

The apparatus can be further configured to store data with a cyclic shift, e.g., CSR, operation in successive tiers of the 3D array of memory cells, as described in connection with FIGS. 6-9. The successive tiers can include the parity check tier for the single set of stored parity check symbols. The apparatus can be configured to determine, e.g., encode, a single stored set of parity check symbols by addition of symbols corresponding to data stored in memory cells of the 3D array, where the addition of the symbols can include addition of the subsets of the symbols corresponding to sequences of stored data obliquely oriented in the successive tiers by the cyclic shift, e.g., CSR, operation.

In one or more embodiments, the apparatus can be further configured to store each of the sequences of data in one memory cell per tier, as described in connection with FIGS. 6-9, where the tiers extend from a first tier in the 3D array through a penultimate tier contiguous to a parity check tier for parity check symbols, the first tier and the parity check tier formed on opposite sides of the 3D array. The apparatus can be further configured to determine, e.g., encode, a set of parity check symbols for the parity check tier by separate addition of symbols corresponding to each of the sequences of stored data. The addition can, in some embodiments, be an XOR operation performed on the symbols of cyclic shifted data stored in the successive tiers, e.g., as described in connection with FIGS. 3-4 and 6-8.

The apparatus can be further configured to store the same number of parity check symbols as a single set of parity check symbols in the parity check tier to enable recovery of all potential data storage errors, e.g., as a set of values described in connection with FIGS. 8-9. The same number of parity check symbols can be determined, e.g., encoded, to equal a total number of memory cells in at least one tier of memory cells other than the parity check tier, e.g., a total of a number of memory cells in an X dimension multiplied by a number of memory cells in a Y dimension of the tier, which can equal a number of pillars.

In one or more embodiments, the apparatus, as described herein, can further be configured to selectably recover a single data storage error based, at least in part, on the same number of parity check symbols, e.g., Z+1, for either the first subset of memory cells oriented parallel to the first dimension or the second subset of memory cells oriented parallel to the second dimension. The same number of parity check symbols can be a single set of stored parity check symbols. The apparatus can be further configured to either store the parity check symbols in a parity check tier in a 3D array of memory cells, e.g., as described in connection with FIGS. 2, 4, and 7, and/or to store the parity check symbols as a parity check tier in memory coupled to the 3D array of memory cells.

In one or more embodiments, the apparatus can be further configured to selectably recover a data storage error for a pillar or a tier of a 3D array of memory cells based, at least in part, on the same number of parity check symbols, e.g., Z+1, used for recovery of the pillar and the tier. Accordingly, a single set of parity check symbols enables selectable performance of either an error recovery operation for a pillar or an error recovery operation for a tier of the 3D array of memory cells.

The apparatus can be further configured to recover, e.g., decode, the data storage error with an XOR operation performed on symbols corresponding to obliquely oriented data sequences stored with a cyclic shift, e.g., CSR, operation in successive tiers of the 3D array, where the XOR operation can include symbols for the obliquely oriented data sequences stored in a tier of parity check symbols, e.g., as described in connection with FIGS. 8-9. The apparatus can, in some embodiments, be configured to selectably recover a data value or corresponding symbol for a single data storage error for either the pillar of memory cells or for the tier of memory cells. In some embodiments, the apparatus can be configured to selectably recover all the data values or corresponding symbols for either the pillar of memory cells or for the tier of memory cells with the data storage error. In some embodiments, the apparatus can be configured to perform the XOR operation on symbols corresponding to a subset of the symbols in each successive tier of the 3D array that includes a tier of parity check symbols, as described in connection with FIG. 9.

Accordingly, one or more methods for data storage error recovery, as described herein, can include determining a set of symbols corresponding to data stored in a 3D array of memory cells, where sequences of the stored data are obliquely oriented to at least two of three dimensions of the array and adding subsets of symbols to determine a number of parity check symbols. The method can include performing an error recovery operation for a data storage error in a pillar or in a tier of the 3D array based on, at least in part, a single stored set of parity check symbols selectably usable for error recovery operations for both the pillar and the tier.

In one or more embodiments, the method can include storing the data with a cyclic shift, e.g., CSR, operation as obliquely oriented in successive tiers of the 3D array, where the successive tiers can include a tier for the single stored set of parity check symbols. In some embodiments, the single set of parity check symbols can be stored in a parity check tier in the 3D array. The method can include determining, e.g., encoding, the single stored set of parity check symbols by XOR addition of symbols from successive tiers for sequences of obliquely oriented cyclic shifted data.

The method can, in one or more embodiments, include recovering, e.g., decoding, the data storage error with an XOR operation performed on a sequence of symbols corresponding to obliquely oriented data stored with a cyclic shift, e.g., CSR, operation in successive tiers of the 3D array and in the single stored set of parity check symbols. Accordingly, the method can include selectably recovering the data storage error for a pillar or a tier of the 3D array of memory cells based on, at least in part, use of the single stored set of parity check symbols.

The method can include performing an error detection operation to determine a location of a data storage error by sensing data stored in the memory cells of the 3D array, e.g., as described in connection with FIG. 10. In some embodiments, the error detection operation can be initiated by a controller and performed by error determination circuitry included in the 3D array.

Reliability of the data storage error protection described herein can be illustrated by a reduction in fail probability of the stored data when the data values and/or corresponding symbols are not protected and/or recovered. Determination of the fail probability can be calculated with p being a probability of occurrence of a pillar data storage error and q being a probability of occurrence of a tier data storage error. By considering the probabilities of occurrence of a pillar data storage error or of a tier data storage error as being independent, a fail probability for unprotected stored data can be calculated by:

$$P_0=1-(1-p)(1-q) \quad (18)$$

where XY is the number of pillars and Z is the number of tiers. When the data storage error protection techniques described herein are applied to recover the data values and/or corresponding symbols for the pillars and tiers, the fail probability can be calculated by:

$$P=1-(1-p)^{-1}(1-q)^{Z}[1+(XY-1)p+Zq-pq(XY+Z)] \quad (19)$$

For example, if $p=1e^{-13}$ and $q=1e^{-10}$, then $P_0=3e^{-9}$, while $P=2e^{-15}$, which is approximately a $1e^{6}$ reduction in the fail probability using the data storage error protection techniques described herein.

Accordingly, the data storage error protection techniques described herein are designed to recover, e.g., decode, a single data storage error for both a pillar and a tier in a 3D array of memory cells with the same number of parity check symbols, e.g., Z+1, as described herein, used for protection of only of the pillar or the tier. The data storage error protection techniques described herein also are designed to recover, e.g., decode, all potential data storage errors for both a pillar and a tier with the same number of parity check symbols, e.g., equal to or less than a total number of pillars, used for protection of only the pillar or the tier. In addition, the data storage error protection techniques described herein can be used to recover, e.g., decode, a data storage error for both a column and a row in a 2D array with the same number of parity check symbols used for protection of only of the column or the row.

It is to be understood that the present disclosure is not limited to particular devices or methods, which may, of course, vary. It is also to be understood that the terminology used herein is for the purpose of describing particular embodiments only, and is not intended to be limiting. As used herein, the singular forms “a”, “an”, and “the” include singular and plural referents, unless the context clearly dictates otherwise, as do “a number of”, “at least one”, and “one or more”. For example, a number of memory cells can refer to one or more memory cells. Furthermore, the words “can” and “may” are used throughout this application in a permissive sense (i.e., having the potential to, being able to), not in a mandatory sense (i.e., must). The term “include,” and derivations thereof, mean “including, but not limited to.” The terms “coupled” and “coupling” mean to be directly or indirectly connected physically or in signal transmission, as appropriate to the context.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:

an array of memory cells arranged substantially orthogonally in a first dimension and a second dimension; and an error correction component coupled to the array, in combination with a processor, configured, as directed by a controller, to:

determine a set of symbols corresponding to data stored in the memory cells, wherein the set of symbols is obliquely oriented to the first dimension and the second dimension;

add subsets of the set of symbols obliquely oriented to the first dimension and the second dimension to determine a number of parity check symbols;

use a same number of parity check symbols for protection of a first subset of memory cells oriented parallel to the first dimension as used for protection of a second subset of memory cells oriented parallel to the second dimension; and selectably recover a data storage error based on the same number of parity check symbols for either the first subset of memory cells oriented parallel to the first dimension or the second subset of memory cells oriented parallel to the second dimension.

2. The apparatus of claim 1, wherein the same number of parity check symbols is a single set of stored parity check symbols.

3. The apparatus of claim 1, wherein the first subset of memory cells is a column of memory cells and the second subset of memory cells is a row of memory cells in a two-dimensional (2D) plane of the array.

4. The apparatus of claim 1, wherein the first subset of memory cells is a pillar of memory cells and the second subset of memory cells is a tier of memory cells in a three-dimensional (3D) array of memory cells.

5. The apparatus of claim 1, wherein the apparatus is further configured to store the parity check symbols in a parity check tier in a three-dimensional (3D) array of memory cells.

6. The apparatus of claim 1, wherein the apparatus is further configured to store the parity check symbols as a parity check tier in memory coupled to a three-dimensional (3D) array of memory cells.

7. The apparatus of claim 1, wherein the apparatus is further configured to store data with a cyclic shift operation in successive tiers of a three-dimensional (3D) array of memory cells.

8. The apparatus of claim 7, wherein the successive tiers include a parity check tier for a single set of stored parity check symbols.

9. The apparatus of claim 1, wherein the apparatus is further configured to:

selectably recover a data storage error for a pillar or a tier of a three-dimensional (3D) array of memory cells based on the same number of parity check symbols used for recovery of the pillar and the tier.

10. The apparatus of claim 1, wherein the apparatus is further configured to include:

a single set of parity check symbols that enables selectable performance of either an error recovery operation for a pillar or an error recovery operation for a tier of a three-dimensional (3D) array of memory cells.

11. An apparatus, comprising:

a three-dimensional (3D) array of memory cells; and a controller configured to:

determine a location of a data storage error with an error detection operation performed on data stored in the 3D array; and selectably perform, based on a same number of parity check symbols for each, an error recovery operation for the data storage error either in a pillar of memory cells or in a tier of memory cells of the 3D array.

12. The apparatus of claim 11, wherein:

circuitry that performs the error detection operation, as directed by the controller, is coupled to memory of the 3D array;

the location of the data storage error is sent to the controller; and the error recovery operation is performed by the controller.

13. The apparatus of claim 11, wherein the apparatus is further configured to store data with a cyclic shift operation in successive tiers of the 3D array that include a tier for a single stored set of parity check symbols.

14. The apparatus of claim 11, wherein the apparatus is further configured to determine a single stored set of parity check symbols by addition of symbols corresponding to data stored in memory cells of the 3D array.

15. The apparatus of claim 14, wherein the addition of the symbols includes addition of subsets of the symbols corresponding to sequences of stored data obliquely oriented in successive tiers by a cyclic shift operation.

16. The apparatus of claim 15, wherein:

each of the sequences of stored data includes data stored in one memory cell per tier;

the tiers extend from a first tier in the 3D array through a penultimate tier contiguous to a parity check tier for parity check symbols, the first tier and the parity check tier formed on opposite sides of the 3D array; and the apparatus is further configured to determine a set of parity check symbols for the parity check tier by separate addition of symbols corresponding to each of the sequences of stored data.

17. The apparatus of claim 15, wherein the apparatus is further configured to store the same number of parity check symbols as a single set of parity check symbols in a parity check tier to enable recovery of all potential data storage errors;

wherein the same number of parity check symbols is equal to a total number of memory cells in a tier of memory cells other than the parity check tier.

18. The apparatus of claim 14, wherein the addition is an exclusive or (XOR) operation performed on the symbols of cyclic shifted data stored in the successive tiers.

19. An apparatus, comprising:

a three-dimensional (3D) array of memory cells; and a controller configured to:

determine a location of a data storage error with an error detection operation performed on data stored in the 3D array;

selectably perform, based on a same number of parity check symbols for each, an error recovery operation for the data storage error either in a pillar of memory cells or in a tier of memory cells of the 3D array; and recover the data storage error with an exclusive or (XOR) operation performed on symbols corresponding to obliquely oriented data sequences stored with a cyclic shift operation in successive tiers of the 3D array;

wherein the XOR operation includes symbols for the obliquely oriented data sequences stored in a tier of parity check symbols.

20. The apparatus of claim 19, wherein the apparatus is further configured to selectably recover a data value or corresponding symbol for a single data storage error for either the pillar of memory cells or for the tier of memory cells.

21. The apparatus of claim 19, wherein the apparatus is further configured to selectably recover all the data values or corresponding symbols for either the pillar of memory cells or for the tier of memory cells with the data storage error.

22. The apparatus of claim 19, wherein the apparatus is further configured to:

recover the data storage error for a pillar of memory cells with an XOR operation performed on symbols corresponding to obliquely oriented data sequences stored with a cyclic shift operation;

wherein the XOR operation is performed on symbols corresponding to a subset of the symbols in each successive tier of the 3D array that includes the tier of parity check symbols.

23. The apparatus of claim 19, wherein the 3D array of memory cells is configured in a NAND array architecture.

24. A method for error recovery, comprising:

determining a set of symbols corresponding to data stored in a three-dimensional (3D) array of memory cells, wherein sequences of the stored data are obliquely oriented to at least two of three dimensions of the array;

adding subsets of symbols to determine a number of parity check symbols; and performing an error recovery operation for a data storage error in a pillar or in a tier of the 3D array based on a single stored set of parity check symbols selectably usable for error recovery operations for both the pillar and the tier.

25. The method of claim 24, including storing the single set of parity check symbols in a parity check tier in the 3D array.

26. The method of claim 24, including storing the data with a cyclic shift operation as obliquely oriented in successive tiers of the 3D array, wherein the successive tiers include a tier for the single stored set of parity check symbols.

27. The method of claim 24, including determining the single stored set of parity check symbols by exclusive or (XOR) addition of symbols from successive tiers for sequences of obliquely oriented cyclic shifted data.

28. The method of claim 24, including recovering the data storage error with an exclusive or (XOR) operation performed on a sequence of symbols corresponding to obliquely oriented data stored with a cyclic shift operation in successive tiers of the 3D array and in the single stored set of parity check symbols.

29. The method of claim 24, including selectably recovering the data storage error for a pillar or a tier of the 3D array of memory cells based on use of the single stored set of parity check symbols.

30. The method of claim 24, including recovering the data storage error for a pillar of memory cells with an exclusive or (XOR) operation performed on symbols corresponding to obliquely oriented data stored with a cyclic shift operation;

wherein the symbols correspond to a subset of the symbols in each successive tier of the 3D array that includes the single stored set of parity check symbols.

31. The method of claim 24, including performing an error detection operation to determine a location of a data storage error by sensing data stored in the memory cells of the 3D array.

* * * * *